United States Patent [19]
Selcuk

[11] Patent Number: 5,793,671
[45] Date of Patent: Aug. 11, 1998

[54] STATIC RANDOM ACCESS MEMORY CELL UTILIZING ENHANCEMENT MODE N-CHANNEL TRANSISTORS AS LOAD ELEMENTS

[75] Inventor: Asim A. Selcuk, Cupertino, Calif.

[73] Assignee: Advanced Micro Devices, Inc., Sunnyvale, Calif.

[21] Appl. No.: 786,428

[22] Filed: Jan. 21, 1997

[51] Int. Cl.$^6$ .................................................. C11C 11/00
[52] U.S. Cl. .................... 365/154; 365/156; 365/210; 365/189.09
[58] Field of Search ................................ 365/154, 156, 365/210, 189.09

[56] References Cited

U.S. PATENT DOCUMENTS 5,020,028  5/1991  Wanlass ................................ 365/154
5,148,390  9/1992  Hsieh ................................... 365/154
5,473,568  12/1995  Okamura .............................. 365/210

*Primary Examiner*—Huan Hoang
*Attorney, Agent, or Firm*—Foley & Lardner

[57] ABSTRACT

An SRAM cell for use in a microprocessor includes enhancement mode load transistors. A control or bias circuit is coupled to the gates and drains of the load transistors to appropriately bias the load transistors. The bias circuit responds to feedback from a dummy cell to appropriately bias the load transistors. The bias circuit can operate in a refresh mode, a feedback mode, a bias mode, or access mode. The bias circuit allows the SRAM cell to operate quickly, stably, and with minimal current.

20 Claims, 2 Drawing Sheets

STATIC RANDOM ACCESS MEMORY CELL UTILIZING ENHANCEMENT MODE N-CHANNEL TRANSISTORS AS LOAD ELEMENTS

FIELD OF THE INVENTION

The present invention relates generally to memory storage devices. More particularly, the present invention relates to a memory cell and a biasing circuit for such a memory cell.

BACKGROUND OF THE INVENTION

Semiconductor devices such as random access (RAM) devices typically include a number of memory cells coupled to at least one bit line. The memory cells often include at least one storage device, storage node, and pass gate transistor. Generally, in a static random access memory (SRAM) cell, two storage devices are coupled between two pass gate transistors, and a bit line is coupled to each of the pass gate transistors. Thus, each memory cell is often located between two bit lines.

The pass gate transistors (e.g., transfer gates) have gate electrodes which are coupled to word lines. A signal such as an address or select signal is provided on the word line associated with the memory cell to select or access a particular memory cell. Once the memory cell is selected via the word line, the memory cell can be read or written to through the pass gate transistors via the bit lines.

The memory cell of the SRAM often contains two inverters connected in anti-parallel. Basically, each cell is a flip-flop which has two stable states (e.g., a logic 1 or a logic 0). The memory cell is generally made of four or six transistors. In a four transistor SRAM cell, a first resistor is coupled in series with a first pull down (e.g., storage or drive) transistor at a first storage node, and a second resistor is coupled in series with a second pull down transistor at a second storage node. A first pass gate is coupled between a first bit line and a first storage node, and a second pass gate is coupled between a second bit line and a second storage node.

In a six transistor memory cell, the first and second resistors are replaced by first and second load transistors. The load transistors are typically P-channel transistors or depletion mode N-channel transistors. The pull down transistors and pass gate transistors for both four and six transistor memory cells are usually N-channel enhancement mode transistors.

Conventional four transistor memory cells generally consume more power than conventional six transistor memory cells. Additionally, the first and second resistors are difficult to fabricate and can occupy a significant amount of space on the integrated circuit. Conventional six transistor memory cells are also somewhat difficult to manufacture because separate and additional process steps are necessary to make the P-channel load transistors or to make the N-channel depletion mode transistors. For example, separate N-wells must be fabricated for the P-channel load transistors. Similarly, N-channel depletion mode transistors require different process steps and more substrate area.

Some conventional six transistor memory cells have been manufactured with enhancement mode N-channel load transistors. The enhancement mode N-channel load transistor of these conventional cells has its gate fixed to its drain and its drain fixed to a power supply voltage. The enhancement mode N-channel load transistor has a large leakage current because it is essentially always at least partially turned on. The large leakage current of the load transistor contributes to the amount of power which is consumed by the memory cell. As a result, the leakage current adds to the constant power associated with the semiconductor memory device.

Thus, there is a need for a memory cell which includes N-channel enhancement load transistors which is optimized for lower leakage current characteristics. Further, there is a need for a memory cell which utilizes enhancement N-channel transistors which have their gates and drains controlled to enhance memory cell operation. Further still, there is a need for a stable, yet fast, memory cell of small size which consumes minimal power.

SUMMARY OF THE INVENTION

The present invention relates to a semiconductor memory device. The semiconductor memory device includes a memory cell, and a bias circuit. The memory cell includes at least one N-channel load transistor and at least one drive transistor coupled in series with the load transistor at a storage node. The load transistor has a gate and a drain. The bias circuit has a drain output coupled to the drain and a gate output coupled to the gate. The bias circuit can provide a gate bias signal at the gate output and a drain bias signal at the drain output. The bias circuit can generate the gate bias signal to refresh the storage node.

The present invention relates to an SRAM memory. The SRAM memory includes a memory cell, a dummy cell, and a bias means. The memory cell includes at least one N-channel load transistor and at least one drive transistor coupled in series with the load transistor. The load transistor has a gate. The bias means generates a gate bias signal for the gate of the N-channel load transistor in response to a feedback signal from the dummy cell.

The present invention further relates to a semiconductor memory device including a memory cell and a bias circuit. The memory cell includes at least one N-channel load transistor and at least one drive transistor. The load transistor has a source, a gate, and a drain. The source is coupled to the drive transistor. The bias circuit has a gate output coupled to the gate of the load transistor. The bias circuit provides a gate bias signal at the gate output to appropriately bias the load transistor.

In one aspect of the present invention, an SRAM cell utilizes N-channel enhancement mode transistors as load transistors. The load transistors have their drains and gates coupled to a bias circuit. The bias circuit provides the drain and gate voltages so that the load transistors have optimum operational characteristics. For example, the load transistors are biased such that the load transistors provide sufficient current to prevent the memory cell from losing its stored state and yet does not provide too much current so as to waste power. Preferably, the load transistors are biased to provide a slightly higher leakage current than the leakage current of the drive transistors associated with the cell.

In another aspect of the present invention, the bias circuit is coupled to a dummy cell. The dummy cell provides feedback to the bias circuit so that the bias circuit can adjust the bias signal to the load transistors in accordance with changes over temperature, operating voltages, fabrication variations, and other parameters. The dummy cell is preferably identical to other memory cells in the array and is set to store a logic 1 or 0.

In accordance with still another exemplary aspect of the present invention, the bias circuit can turn off the enhancement mode N-channel load transistors when the memory cell is accessed (e.g., during a read operation or a write operation). The load transistors can also be effectively turned off by the bias circuit until the cell needs to be refreshed. The bias circuit refreshes the memory cell by turning on the load transistors when the voltage at the storage node falls below a threshold.

In accordance with yet another exemplary aspect of the present invention, the bias circuit provides a higher voltage than the VCC voltage to the gate of the load transistor so that the threshold drop across the load transistor does not affect the stored logic signal in the memory cell. The load transistors are configured by the bias circuit to utilize a minimal amount of power and yet enable operation of a stable, high speed memory cell. Thus, the memory cell of the present invention can be manufactured with enhancement mode N-channel transistors which can be advantageously fabricated according to the same processes as the drive transistors and pass gate transistors.

Additionally, the bias circuit provides a higher voltage than the VCC voltage so that the threshold drop across the load transistor does not affect the storage logic signal in the memory cell. Preferably, the bias circuit provides a voltage of VCC plus the voltage threshold to the gate of the load transistor. Thus, the memory cell of the present invention can be manufactured with enhancement mode N-channel transistors which can be manufactured according to the same process as the drive transistors and pass gate transistors.

BRIEF DESCRIPTION OF THE DRAWINGS

The invention will hereafter be described with reference to the accompanying drawings wherein like numerals denote like elements, and.

DETAILED DESCRIPTION OF THE PREFERRED EMBODIMENTS

Figure 1:
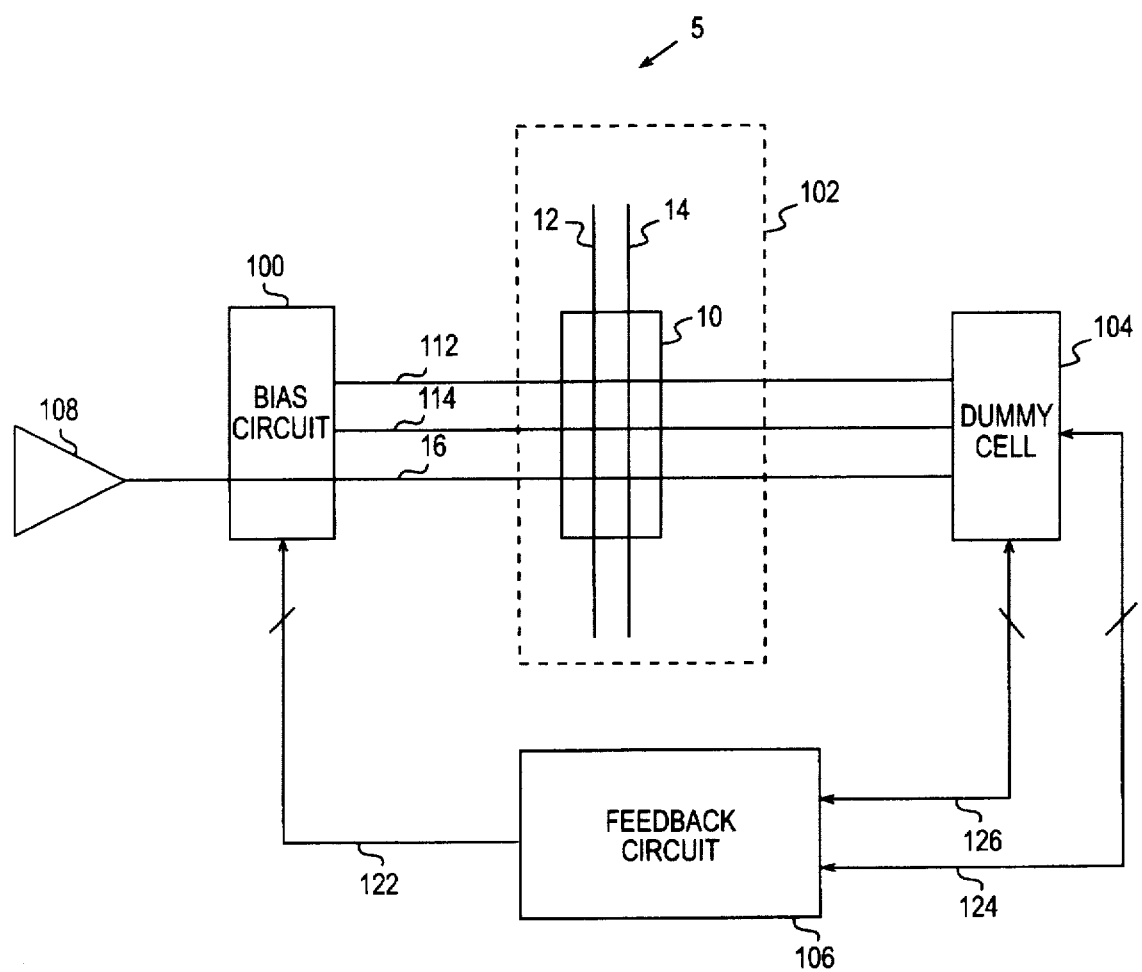
FIG. 1 is an electrical schematic drawing of a memory system including a memory cell in accordance with an exemplary embodiment of the present invention.

With reference to FIG. 1, a memory system 5 is comprised of a bias circuit 100, an array 102 of cells, such as, a memory cell 10, a dummy cell 104, a feedback circuit 106, and a word line driver 108. Memory cell 10 is coupled between complementary bit lines 12 and 14 and is coupled to a drain bias line 112, a gate bias line 114, and a word line 16. Bias circuit 100 receives a feedback signal on a feedback line 122 from feedback circuit 106 and receives a select signal on word line 16 from word line driver 108. The feedback signal can be comprised of several signals provided on several conductors. Feedback circuitry 106 provides bias signals to dummy cell 104 on bias lines 124 and 126 and receives feedback signals from dummy cell 104 on lines 124 and 126.

Figure 2:
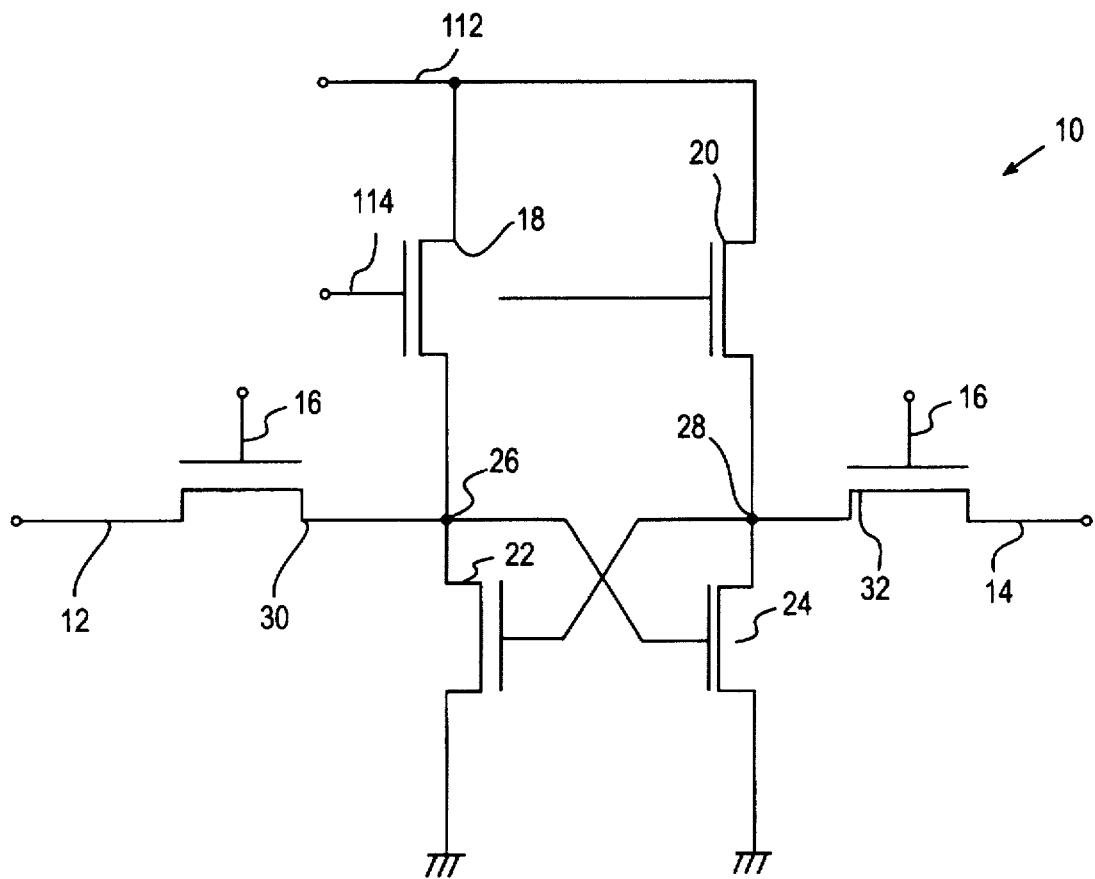
FIG. 2 is a more detailed electrical schematic drawing of the memory cell illustrated in FIG. 1 in accordance with an exemplary embodiment of the present invention.

With reference to FIG. 2, memory cell 10 is preferably a static random access memory cell (SRAM), including a load transistor 18, a load transistor 20, a driver or pull down transistor 22, and a driver or pull down transistor 24. Transistors 18, 20, 22, and 24 are all preferably contained within a P-well or a P-type substrate, and transistors 22 and 24 are coupled together to form cross-coupled inverters having a storage node 26, and a storage node 28. Transistors 18, 20, 22, and 24 are preferably N-channel enhancement mode transistors which have a threshold voltage of approximately 0.5 to 0.6 volts, although transistors with other threshold voltages could be utilized. Alternatively, transistors 22 and 24 can be replaced with other types of transistors. Transistors 22 and 24 can be a lower threshold ($V_T$) device, especially if transistors 22 and 24 are turned off during storage.

Storage node 26 is coupled to a pass gate transistor 30 which is controlled by word line 16. Storage node 28 is coupled to a pass gate transistor 32 which is also controlled by word line 16. Pass gate transistors 30 and 32 are preferably N-channel enhancement mode transistors having a gate threshold voltage between 0.5 and 0.6 volts, although other types of transistors may be utilized.

Generally, cell 10 stores a logic signal, data, or other information, such as, a logic 1 (e.g., VCC) or a logic 0 (e.g., ground) in nodes 26 and 28. When transistor 22 is turned on, node 26 is coupled to ground and transistor 24 is turned off. Conversely, when transistor 22 is turned off, transistor 24 is turned on and node 28 is coupled to ground. Generally, the logic level stored on node 26 is opposite the logic level stored on node 28.

Cell 10 is accessed for reading from and for writing to nodes 26 and 28 when a select signal, such as, a logic 1 or VCC, is provided on word line 16. The VCC signal can be 5 V, 3.3 V, or other voltage levels greater than the threshold voltage of transistors 30 and 32. Memory cell 10 is accessed as pass gate transistors 30 and 32 couple bit lines 12 and 14 to nodes 26 and 28, respectively, in response to the select signal on word line 16. The select signal is provided by driver 108 (FIG. 1) in response to an address signal.

In a read operation, cell 10 is accessed by providing the select signal on line 16. During the read operation, the signal at storage node 26 is provided to bit line 12, while the signal at storage node 28 is provided to bit line 14. The signals on lines 12 and 14 can be read by a sense amplifier (not shown) coupled to lines 12 and 14. Lines 12 and 14 can be precharged or equalized before reading cell 10. The signals on lines 12 and 14 are complementary. In a write operation, cell 10 is accessed by providing a select signal on line 16. During the write operation, the signal on bit line 12 is driven to node 26, while the signal on bit line 14 is driven to node 18. After the select signal on line 16 is removed, cell 10 stores the signals driven on lines 12 and 14 on nodes 26 and 28, respectively.

Alternatively, cell 10 can be a different type of memory cell, such as, a shift register, DRAM cell, or other device. The principles of the present invention can be applied to all types of memory cells which utilize transistors.

With reference to FIGS. 1 and 2, bias circuit 100 provides a drain bias signal (LVCC) on drain bias line 112 and a gate bias signal (LG) on gate bias line 114 for both of transistors 18 and 20. Bias circuit 100 can be configured for several modes of operation to provide superior operational characteristics of transistors 18 and 20 as well as cell 10. For example, bias circuit 100 and feedback circuit 106 can be configured to operate in a BIAS mode to optimize operational characteristics for cell 10, a FEEDBACK mode to optimize operational characteristics over temperature, process, and voltage supply variations, a REFRESH mode to provide power saving features for cell 10, or an ACCESS mode to provide power saving features and high speed operation of cell 10. Alternatively, the features of these modes may be combined or merged to provide various combinations of the operational modes.

In the BIAS mode, bias circuit 100 provides a gate bias signal slightly greater than the VCC signal to compensate for the threshold voltage associated with transistors 18 and 20. In this way, the voltage stored at nodes 26 and 28 can be set to the full power supply voltage, VCC, which improves the noise immunity and stability of memory cell 10. Additionally, bias circuit 100 controls the drain bias signal and gate bias signal so the operational parameters of transistors 18 and 20 are optimized for low leakage current operation. For example, the drain bias signal and gate bias signal may be adjusted such that transistors 18 and 20 provide slightly more current than the leakage current associated with transistors 22 and 24. Preferably, the current provided by transistors 18 and 20 is sufficient to prevent memory cell 10 from losing the state stored on nodes 26 and 28 and yet low enough to prevent wasted power in cell 10.

Alternatively, bias circuit 100 can control transistors 18 and 20 simply with the gate bias signal or simply with the drain bias signal. The gate bias signal and the drain bias signal are preferably set to a level for worst case scenario operational parameters of transistors 18, 20, 22, and 24.

In the FEEDBACK mode, bias circuit 100 receives feedback signals on line 122 from feedback circuit 106. Feedback circuit 106 provides a dummy drain bias signal and a dummy gate bias signal on lines 124 and 126, respectively, to dummy cell 104. Feedback circuit 106 monitors the operation of dummy cell 104 and provides feedback signals to bias circuit 100 in accordance with the operation of dummy cell 104. Dummy cell 104 preferably has an identical layout to memory cell 10 and has been subjected to the same process during fabrication. Accordingly, cell 104 has substantially the same temperature, voltage, and other operating characteristics as cell 10.

Bias circuit 100 adjusts the drain bias signal and the gate bias signal on lines 112 and 114 in accordance with the feedback signals. With such an advantageous scheme utilizing feedback circuit 106 and dummy cell 104, bias circuit 100 can compensate for temperature variations, process variations, and power supply variations which may affect the operation of cell 10. In this way, transistors 18 and 20 can be controlled more precisely to appropriately provide current to nodes 26 and 28.

Circuit 106 preferably includes a reference voltage comparator (not shown) for generating the feedback signals on line 122. Circuit 106 may include a resistor divider, operational amplifier or other bias generator devices, to provide the appropriate bias signals to cell 10 through circuit 100. Circuit 106 preferably provides the bias signals for circuit 100. The comparator monitors the voltage on the storage nodes (not shown) of dummy cell 104. If the voltage is below a first threshold, circuit 106 produces the feedback signals to indicate that the gate bias signal or the drain bias signal or both should be increased. If the voltage is above a second threshold, circuit 106 produces the feedback signals to indicate that the gate bias signal, the drain bias signal, or both should be decreased. The comparator can be provided using an operational amplifier. Alternatively, sophisticated analog circuitry can be provided to monitor other operational parameters of dummy cell 104, such as parameters that provide an indication of the leakage current associated with the dummy drive transistors or the turn-on characteristics of the dummy load transistors. The analog circuitry can then adjust the gate bias and drain bias signals in response to the monitored parameters of cell 104.

In the REFRESH mode, bias circuit 100 can remove the gate bias signal, the drain bias signal, or both provided to transistors 18 and 20, thereby turning transistors 18 and 20 off. By turning transistors 18 and 20 off, current is not provided to nodes 26 and 28 and power is saved.

In the REFRESH mode, bias circuit 100 and feedback circuit 106 monitor the voltage stored on the storage nodes of dummy cell 104. Preferably, bias circuit 100 receives the voltage level associated with the logic 1 signal which is stored on either node of cell 104 (depending upon the state which is being stored in cell 104). The voltage on the nodes of cell 104 is representative of the voltage on nodes 26 and 28 of cell 10 in array 102.

Bias circuit 100 compares the stored logic 1 signal to a threshold. If the threshold is below a certain amount (preferably 90% of the maximum stored voltage level, commonly VCC), bias circuit 100 provides the gate bias signal, the drain bias signal, or both to transistors 18 and 20 so that current can be supplied to nodes 26 and 28. The current from transistors 18 and 20 preferably raises the voltage at node 26 or 28 closer to maximum stored voltage level. After the appropriate voltage level is reached, bias circuit 100 can remove the gate bias signal.

Bias circuit 100 can include a resistor divider, or other reference circuit (not shown) to make a comparison between the voltage in cell 104 and the threshold voltage. Circuit 100 can include a comparator (not shown) or other device for monitoring the logic high stored on nodes 26 or 28. The comparator can be configured to provide hysteresis to reduce ON/OFF cycling of the gate bias signal, drain bias signal, or both.

In the ACCESS mode, bias circuit 100 preferably removes the gate bias signal on line 114 when cell 10 is being accessed (during a read operation or during a write operation). In this way, cell 10 can be read from and written to more quickly. Preferably, bias circuit 100 would respond to a read or write signal, word line decode, address signal, microprocessor control signal, or other signal which indicates that cell 10 is about to be accessed. Preferably, preparatory to accessing cell 10, control circuit 100 removes the gate bias signal at line 114. Alternatively, circuit 100 can remove the drain bias signal preparatory to accessing cell 10.

Memory array 102 including cell 10 can be integrated with a microprocessor, or other integrated circuit device. The microprocessor provides a control signal preparatory to accessing cell 10.

Utilizing dummy cell 104, feedback circuit 106, and bias circuit 100 enables reduction in the number of process steps required to fabricate cell 10 because transistors 18, 20, 22, 24, 30 and 32 are all the same type. In addition, this innovative control technique can result in a reduced size of cell 10 because transistors 18, 20, 22, 24, 30 and 32 are all the same type of transistors.

It is understood that while the detailed drawings and specific examples given describe the preferred exemplary embodiments of the present invention, they are for the purpose of illustration only. The apparatus and method of the invention is not limited to the precise details, geometries, dimensions, voltages, and conditions disclosed. For example, although particular drain threshold voltages are described as being particular values, other voltages could be utilized. Further, although certain types of memory cells are discussed, other types of memory cells can be utilized. Further still, single lines in the various drawings can represent multiple conductors. Various changes can be made to the details without departing from the scope of the spirit of the invention which is defined by the following claims.

What is claimed is:

1. A semiconductor memory device, comprising:
   a memory cell including at least one N-channel load transistor and at least one drive transistor coupled in series with the load transistor at a storage node, the load transistor having a gate and a drain; and a configurable bias circuit having a drain output coupled to the drain and a gate output coupled to the gate, the bias circuit controlling a gate bias signal at the gate output and a drain bias signal at the drain output.

2. The semiconductor memory device of claim 1 wherein the memory device is an SRAM device and the memory cell includes two N-channel load transistors.

3. The semiconductor memory device of claim 1 further comprising a dummy memory cell coupled to the bias circuit, the bias circuit receiving a feedback signal from the dummy cell and generating the drain bias signal and the gate bias signal in response to the feedback signal.

4. The semiconductor memory device of claim 3 wherein the load transistor is an enhancement mode transistor.

5. The semiconductor memory device of claim 1 wherein the gate bias signal is removed when the memory cell is accessed.

6. The semiconductor memory device of claim 1 wherein the bias circuit provides the gate bias signal when a voltage at the storage node falls below a threshold.

7. The semiconductor memory device of claim 3 wherein the dummy cell receives a dummy gate bias voltage from the bias circuit and provides the feedback signal in response to the dummy gate bias signal.

8. An SRAM memory, comprising:

a memory cell including at least one N-channel load transistor and at least one drive transistor coupled in series with the load transistor, the load transistor having a gate;

a dummy cell; and a bias means for generating a gate bias signal for the gate of the N-channel load transistor in response to a feedback signal from the dummy cell.

9. The SRAM semiconductor memory of claim 8 wherein the load transistor is an enhancement mode transistor.

10. The SRAM semiconductor memory of claim 9 wherein the load transistor includes a drain coupled to the bias means.

11. The SRAM semiconductor memory of claim 10 wherein the drain receives a drain bias signal, the bias means generating the drain bias signal and the gate bias signal to provide optimal operation of the load transistor in the memory cell.

12. The SRAM semiconductor memory of claim 10 wherein the drive transistor is an N-channel transistor.

13. The SRAM semiconductor memory of claim 8 wherein the bias means provides a dummy bias signal to the dummy cell.

14. The SRAM semiconductor memory of claim 8 wherein the dummy cell includes at least one N-channel enhancement mode load transistor.

15. The SRAM semiconductor memory of claim 11 wherein the memory is integrated with a microprocessor and the bias means removes the gate bias signal or the drain bias signal when the memory cell is accessed.

16. A semiconductor memory device, comprising:

a memory cell including at least one N-channel load transistor and at least one drive transistor, the load transistor having a source, a gate and a drain, the source being coupled to the drive transistor and the drain being coupled to a VCC signal; and a configurable bias circuit having a gate output coupled to the gate of the load transistor, the bias circuit having a plurality of modes and controlling a gate bias signal at the gate output to bias the load transistor, wherein the bias circuit is configurable to set the gate bias signal slightly greater than the VCC signal.

17. The semiconductor memory device of claim 16 further comprising a dummy memory cell coupled to the bias circuit, the bias circuit receiving a feedback signal from the dummy cell and generating the gate bias signal in response to the feedback signal.

18. The semiconductor memory device of claim 17 wherein the dummy cell receives a dummy gate bias voltage from the bias circuit and provides the feedback signal in response to the dummy gate bias signal.

19. The semiconductor memory cell of claim 18 wherein the load transistor is an enhancement mode transistor.

20. The semiconductor memory cell of claim 19 wherein the drive transistor is an N-channel transistor.

* * * * *